United States Patent [19]
Takahashi et al.

[11] Patent Number: 6,033,942
[45] Date of Patent: Mar. 7, 2000

[54] METHOD OF FORMING A METAL-SEMICONDUCTOR FIELD EFFECT TRANSISTORS HAVING IMPROVED INTERMODULATION DISTORTION USING DIFFERENT PINCH-OFF VOLTAGES

[75] Inventors: Hidemasa Takahashi; Junko Morikawa, both of Tokyo, Japan

[73] Assignee: NEC Corporation, Tokyo, Japan

[21] Appl. No.: 09/074,464

[22] Filed: May 8, 1998

Related U.S. Application Data

[62] Division of application No. 08/825,052, Mar. 27, 1997, Pat. No. 5,834,802.

[30] Foreign Application Priority Data

Jan. 23, 1996  [JP]  Japan ......................................... 8-8888

[51] Int. Cl.[7] .............................................. H01L 21/338
[52] U.S. Cl. .......................................... 438/167; 438/800
[58] Field of Search ............................... 438/167, 107, 438/800, 156

[56] References Cited

U.S. PATENT DOCUMENTS

| | | | |
|---|---|---|---|
| 4,459,556 | 7/1984 | Nanbu et al. | 257/280 |
| 4,606,113 | 8/1986 | Rode | 29/571 |
| 4,709,251 | 11/1987 | Suzuki | 257/280 |
| 4,734,751 | 3/1988 | Hwang et al. | 257/270 |
| 4,870,478 | 9/1989 | Weitzel et al. | 257/280 |
| 4,921,814 | 5/1990 | Ishikawa et al. | 257/280 |
| 5,148,244 | 9/1992 | Iwasaki | 257/280 |
| 5,252,843 | 10/1993 | Suzuki | 257/284 |
| 5,389,807 | 2/1995 | Shiga | 257/280 |
| 5,455,441 | 10/1995 | Awano | 257/280 |
| 5,602,501 | 2/1997 | Shiga | 257/280 |
| 5,694,069 | 12/1997 | Kasashima et al. | 327/179 |
| 5,955,763 | 8/1997 | Lin | 257/355 |

FOREIGN PATENT DOCUMENTS

| | | | |
|---|---|---|---|
| 1-051669 | 2/1989 | Japan | 256/280 |

OTHER PUBLICATIONS

J.A. Higgins et al., "Analysis and Improvement of Intermodulation Distortion in GaAs Power FET's", *IEEE Transactions on Microwave Theory and Techniques*, vol. MTT–28, No. 1, Jan. 1990 pp. 9–17.

Peter M. Asbeck et al., "Piezoelectric Effects in GaAs FET's and Their Role in Orientation–Dependent Device Characteristics", *IEEE Transactions on Electron Devices*, vol. ED–31, No. 10, Oct. 1984, pp. 1377–1380.

R.A. Pucel, "Profile Designs for Distortion Reduction in Microwave Field–Effect Transistors", *Electron, Lett*, 1978, 14, pp. 205–206.

*Primary Examiner*—Charles Bowers
*Assistant Examiner*—Craig Thompson
*Attorney, Agent, or Firm*—Sughrue, Mion, Zinn, Macpeak & Seas, PLLC

[57] ABSTRACT

A comb-shape MESFET assembly has a plurality of unit FETs including first, second and third groups of unit FETs. The pinch-off voltages of the unit FETs are different from group to group by a step difference. The different pinch-off voltages provide a tailored change in the third-order intermodulation distortion in the output of the MESFET assembly. The step difference in the pinch-off voltage is generated by different thicknesses or impurity concentrations of a semiconductor active layer, different gate length of the unit FETs or different types of stress in the gate insulator films.

29 Claims, 9 Drawing Sheets

METHOD OF FORMING A METAL-SEMICONDUCTOR FIELD EFFECT TRANSISTORS HAVING IMPROVED INTERMODULATION DISTORTION USING DIFFERENT PINCH-OFF VOLTAGES

This is a divisional of application Ser. No. 08/825,052, U.S. Pat. No. 5,834,802, filed Mar. 27, 1997.

BACKGROUND OF THE INVENTION (a). Field of the Invention

The present invention relates to a metal-semiconductor field effect transistor (MESFET, referred to as simply "FET" hereinafter) and, more particularly, to an improvement of an intermodulation distortion characteristic of a FET.

(b). Description of the Related Art

A high speed FET implemented by a compound semiconductor such as GaAs has been used in a power amplifier and an oscillator for a microwave range. The high speed FET is requested to have a reduced intermodulation distortion characteristic due to the recent, remarkable increase in number of transmission channels or amount of data. The term "intermodulation distortion" means an undesirable signal component, in an output of the FET, having a frequency of $mf_1 \pm nf_2$ when a pair of signals having frequencies of $f_1$ and $f_2$ are supplied to the inputs of the FET, wherein m and n each represents an integer. A tertiary or third-order component of the intermodulation distortion is generally represented by "IM3", which includes $2f_1-f_2$ and $f_2-f_1$ frequency components and are dominant distortion in the output signal. The intermodulation distortion is known to originate from an odd-order non-linearity of the FET, as described by J. A. Higgins and R. L. Kuvas, in "Analysis and Improvement of Intermodulation Distortion in GaAs Power FETs", IEEE Trans., Microwave Tech. vol. MTT-28, pp. 9–17, January 1980.

In order to reduce the intermodulation distortion in an output of a FET, reduction of non-linearity in the transfer characteristic of the FET is attempted. Examples of such attempts include a pulse doping technique for a carrier node profile of an active layer of the FET to maintain the transconductance (gm) of the FET as a constant value, as proposed by R. A. Pucel, in "Profile Designs for Distortion Reduction in Microwave Field-Effect Transistors", Electron, Lett, 1978, 14, pp. 205–206. In those attempts, a class A operation is generally assumed in order to obtain a most improved operation in terms of intermodulation distortion.

However, a class AB or F operation should be considered for a highly efficient operation of the FET, wherein the drain current on the operational point is set at a tenth of the maximum drain current of the FET. Accordingly, if the drain current amplitude is relatively small or at an output level 10 dB lower than the maximum output level, the drain current is subjected to clipping by a pinch-off. In this case, even if the transfer characteristic is determined such that the transconductance is maintained as a constant value, the intermodulation distortion characteristic is not improved due to the clipping.

Figure 1:
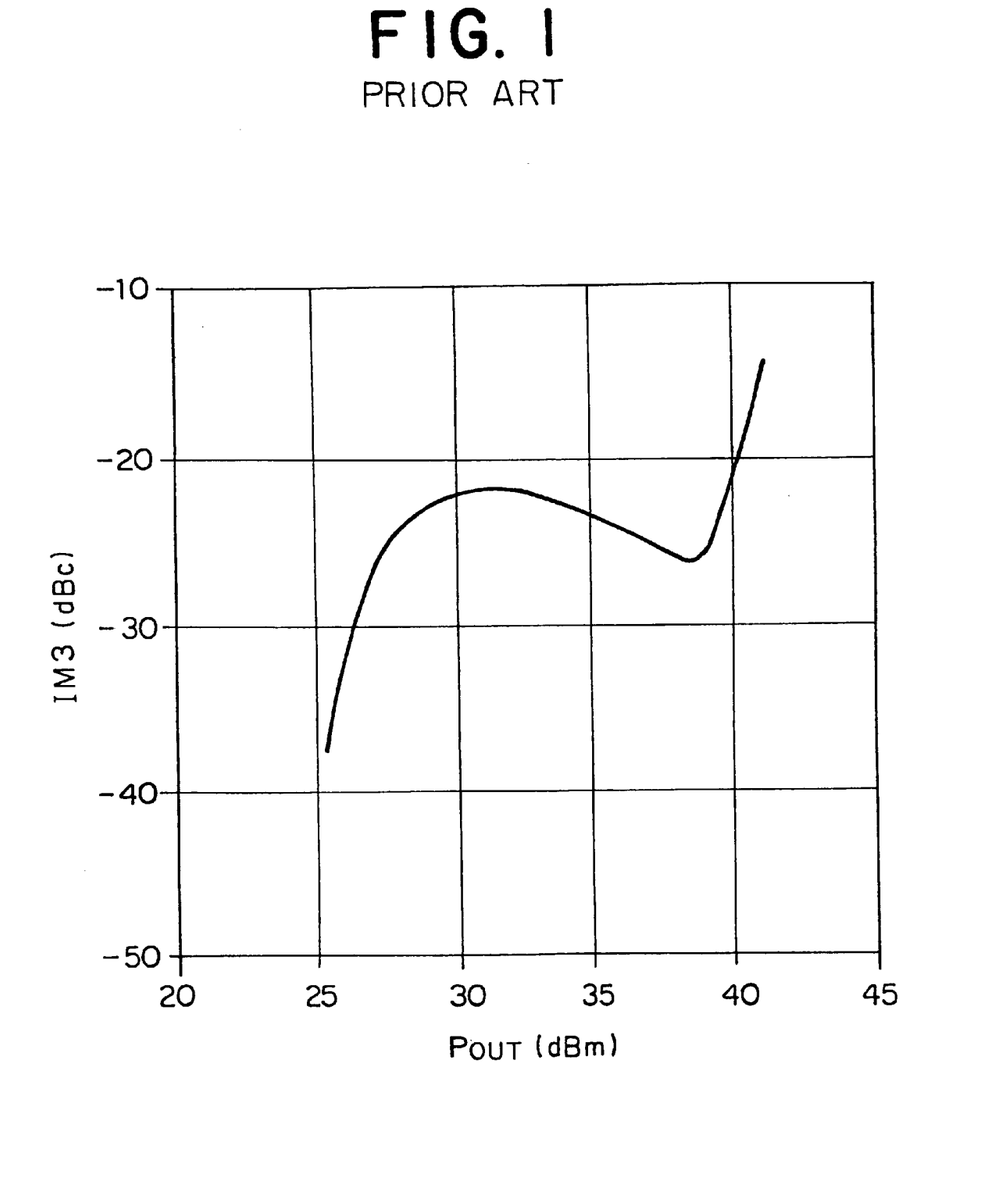
FIG. 1 is a graph showing an output level dependence of IM3 in a FET having an ideally constant transconductance during a class AB operation.

FIG. 1 shows a calculated intermodulation distortion characteristic wherein ordinate and abscissa represent IM3 and output level ($P_{out}$), with the transconductance being maintained at an ideally constant level during a class AB operation. The output resistance, maximum drain current and bias current are 0.5 ohm, 10A and 1A, respectively. As shown in the figure, IM3 rises as high as −22 dBc when the output level $P_{out}$ is around 30 dBm.

In short, the conventional FET has a drawback in that IM3 is high due to the clipping by the pinch-off in a class AB or F operational mode of the FET.

SUMMARY OF THE INVENTION

In view of the above, it is an object of the present invention to provide an improved intermodulation distortion characteristic of a FET during a class AB or F operational mode.

In accordance with the present invention, there is provided a metal-semiconductor field effect transistor (FET) assembly comprising a semi-insulating substrate, a semiconductor active layer formed on the semi-insulating substrate, a source electrode having a plurality of source fingers each disposed in ohmic contact with the semiconductor active layer, a drain electrode having a plurality of drain fingers each disposed in ohmic contact with the semiconductor active layer alternately with the source fingers, and a gate electrode having a plurality of gate fingers, the gate fingers being disposed in Schottky contact with the semiconductor active layer between respective the source fingers and the drain fingers to form a plurality of unit FETs including at least first and second unit FETs, the first unit FET having a first pinch-off voltage different from a second pinch-off voltage of the second unit FET.

With the FET assembly according to the present invention, a third-order component of the intermodulation distortion is reduced due to the plurality of unit FETs having a difference in the pinch-off voltage of the unit FETs, thereby obtaining a tailored change in the transconductance of the FET assembly in the vicinity of the pinch-off voltage thereof.

The above and other objects, features and advantages of the present invention will be more apparent from the following description, referring to the accompanying drawings.

DESCRIPTION OF THE PREFERRED EMBODIMENTS

Figure 2A:
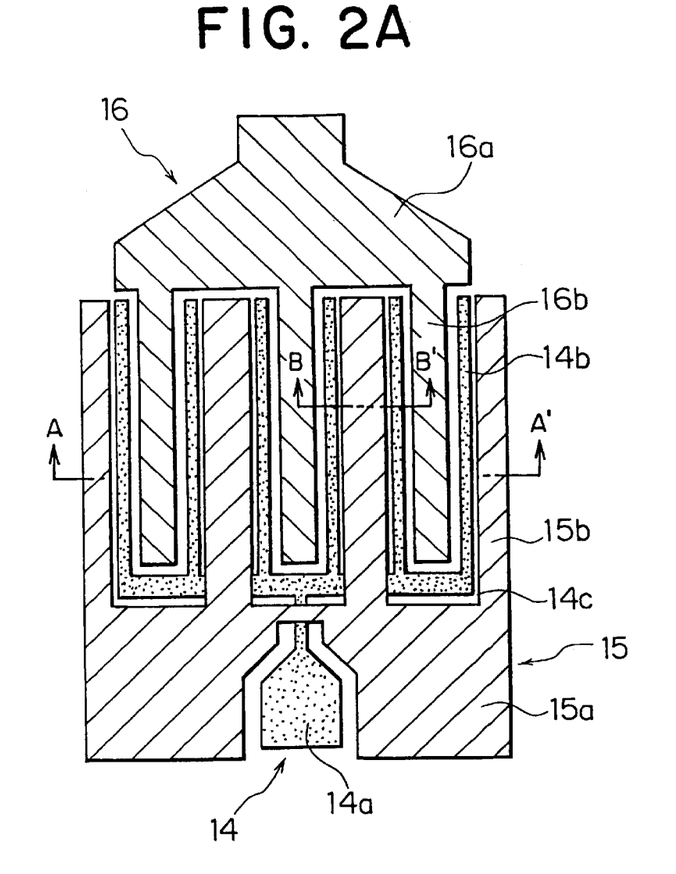
FIGS. 2A and 2B are a plan view of a FET according to a first embodiment of the present invention and a sectional view thereof taken along line A–A' in FIG. 2A, respectively.
Figure 2B:
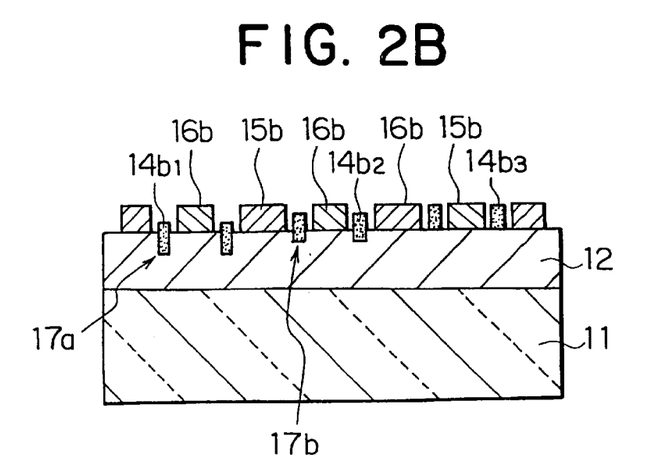

Referring to FIGS. 2A and 2B, a comb-shape FET assembly according to a first embodiment of the present invention comprises a 200-nm thick n-GaAs active layer 12 formed on a semi-insulating GaAs substrate 11. The FET assembly further has a comb-shape source electrode 15, a comb-shape drain electrode 16 and a comb-shape gate electrode 14, all of which are formed on the n-GaAs active layer 12. The comb-shape source electrode 15 has a source pad 15a as a stem portion of the comb and a plurality of source fingers 15b of the comb each disposed in ohmic contact with the active layer 12. The comb-shape drain electrode 16 has a drain pad 16a as a stem portion of the comb and a plurality of drain fingers 16b of the comb. The comb-shape gate electrode 14 has a gate pad 14a, a stem portion 14c of the comb and a plurality of gate fingers 14b each disposed in Schottky contact with the active layer 12.

The source electrode 15 and drain electrode 16 are arranged such that source fingers 15b and drain fingers 16b are arranged alternately, with the gate fingers 14b of the gate electrode 14 being interposed therebetween and such that both the stems 15a and 16a of the combs are disposed opposite to each other, with the gate stem 14c being underlying the source electrode 15.

The active layer 12 formed on the semi-insulating substrate 11 has a carrier concentration of $2.0E17$ $cm^{-3}$ and a plurality of 20-nm deep first recesses 17a and a plurality of 10-nm deep second recesses 17b. As shown in FIG. 2B, the gate electrode 14 has a first group of gate fingers 14b1 formed within the first recesses 17a, a second group of gate fingers 14b2 formed within the second recesses 17b, and a third group of gate fingers 14b3 formed on the top surface of the active layer 12. Each finger group is exemplarily shown to have a pair of fingers 14b in the drawings.

With the configuration of the FET assembly of the present embodiment, each gate finger 14b and a corresponding pair of source finger 15b and drain finger 16b forms a unit FET connected in parallel with the other unit FETs in the FET assembly. The first unit FETs having the gate fingers 14b1 of the first group exhibit a −2.4-volt pinch-off voltage, the second unit FETs having the gate fingers 14b2 of the second group exhibit a −2.0-volt pinch-off voltage, and the third unit FETs having the gate fingers 14b3 of the third group exhibit a −1.6-volt pinch-off voltage. Namely, the step difference in the pinch-off voltage of the unit FETs in the FET assembly is exemplarily set at 0.4 volts in this embodiment.

In the manner as described above, the step difference in the pinch-off voltage of the unit FETs can be controlled at a desired voltage depending on the difference in the depth of the recesses. The number of unit FETs, the value of the step difference, or maximum difference in the pinch-off voltage can be selected as desired.

Figure 3:
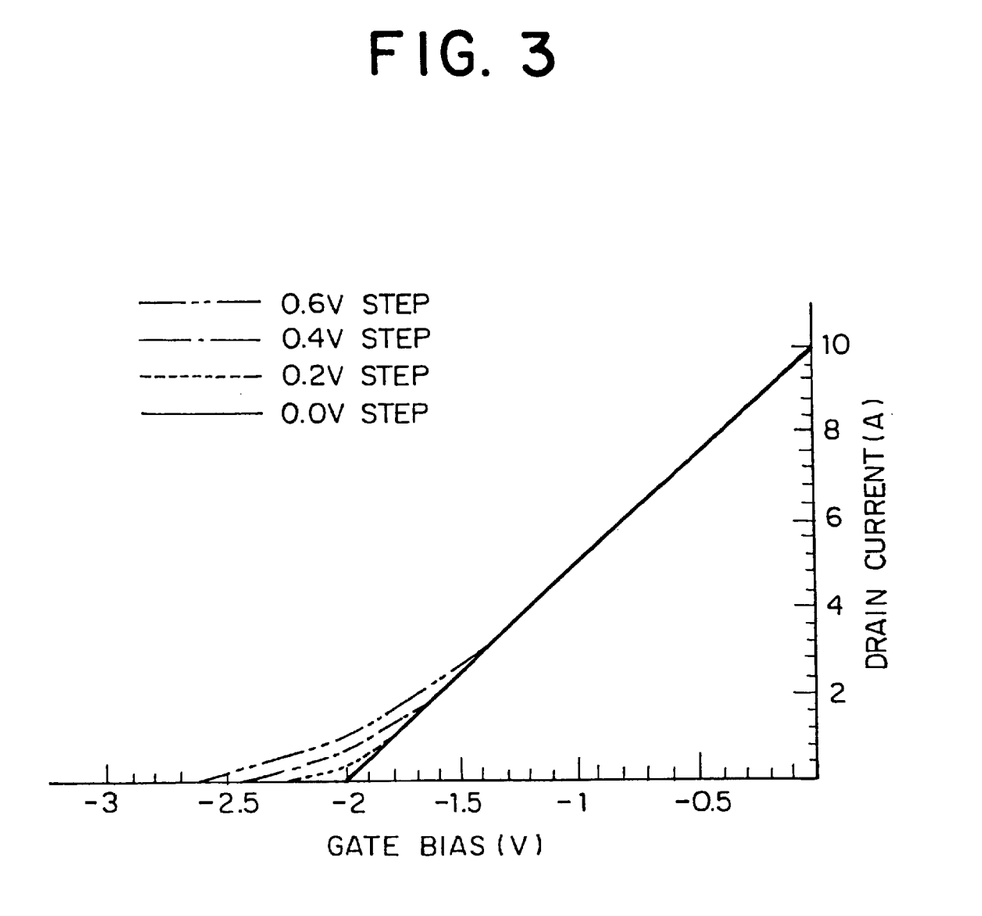
FIG. 3 is a graph showing the relationship between gate bias voltage and drain current of the FET according to the first embodiment, with the step difference in the pinch-off voltage of the unit FETs being a parameter.

FIG. 3 shows a graph of a gate bias dependence of the drain current in the FET assembly as described above having three unit FETs, with the value of the step difference in the pinch-off voltage for the unit FETs being a parameter. The values for the step difference include 0.6 volts shown by a two-dot chain line, 0.4 volts shown by a one-dot chain line, 0.2 volts shown by a broken line and 0.0 volt shown by a solid line, with the mean or median pinch-off voltage being at 2.0 volts and with the drain current at zero gate voltage being 10A at each case. As shown in FIG. 3, the FET assembly including three groups of unit FETs having respective pinch-off voltages has a tailored change in the transconductance in the vicinity of zero drain current.

Figure 4:
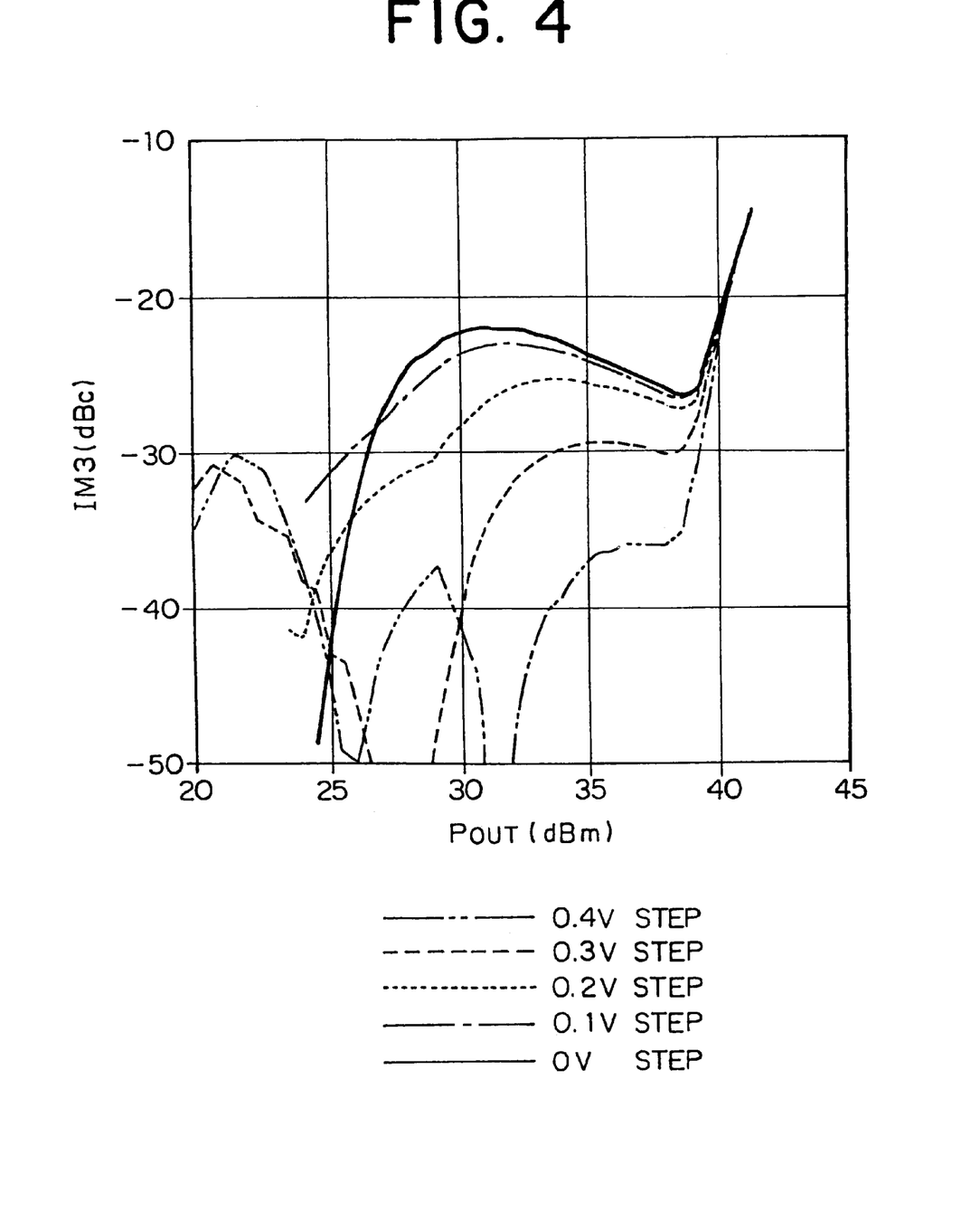
FIG. 4 is a graph showing the relationship between the output level and IM3 of the FET according the first embodiment, with the step difference in the pinch-off voltage of the unit FETs being a parameter, and with the bias current being 1A.

FIG. 4 shows an output level dependence of IM3 (third-order intermodulation distortion component) obtained by calculation in the FET assembly including three unit FETs according to the present embodiment, with the bias current being 1A, and with the value of the step difference in the pinch-off voltage being a parameter. The bias current 1A is obtained by selecting the output resistance at 0.5 ohm. The values of the step difference in the pinch-off voltage of the three-grouped unit FETs include 0.4 volts shown by a two-dot chain line, 0.2 volts shown by a one-dot chain line, 0.1 volts shown by a broken line and 0.0 volt shown by a solid line, with the mean or median inch-off voltage being selected at 2.0 volts. As shown in the drawing, if the step difference is selected between 0.3 and 0.4 volts in the pinch-off voltage of the three-grouped unit FETs, or if the step difference in the pinch-off voltage is selected between 10% and 15% of the mean pinch-off voltage provided that the bias current is selected at 10% of the maximum drain current, for example, then IM3 can be reduced down to a level below −30 dBc. As a matter of course, the optimum value for the step difference in the pinch-off voltage depends on the selected bias for the drain current.

Figure 5:
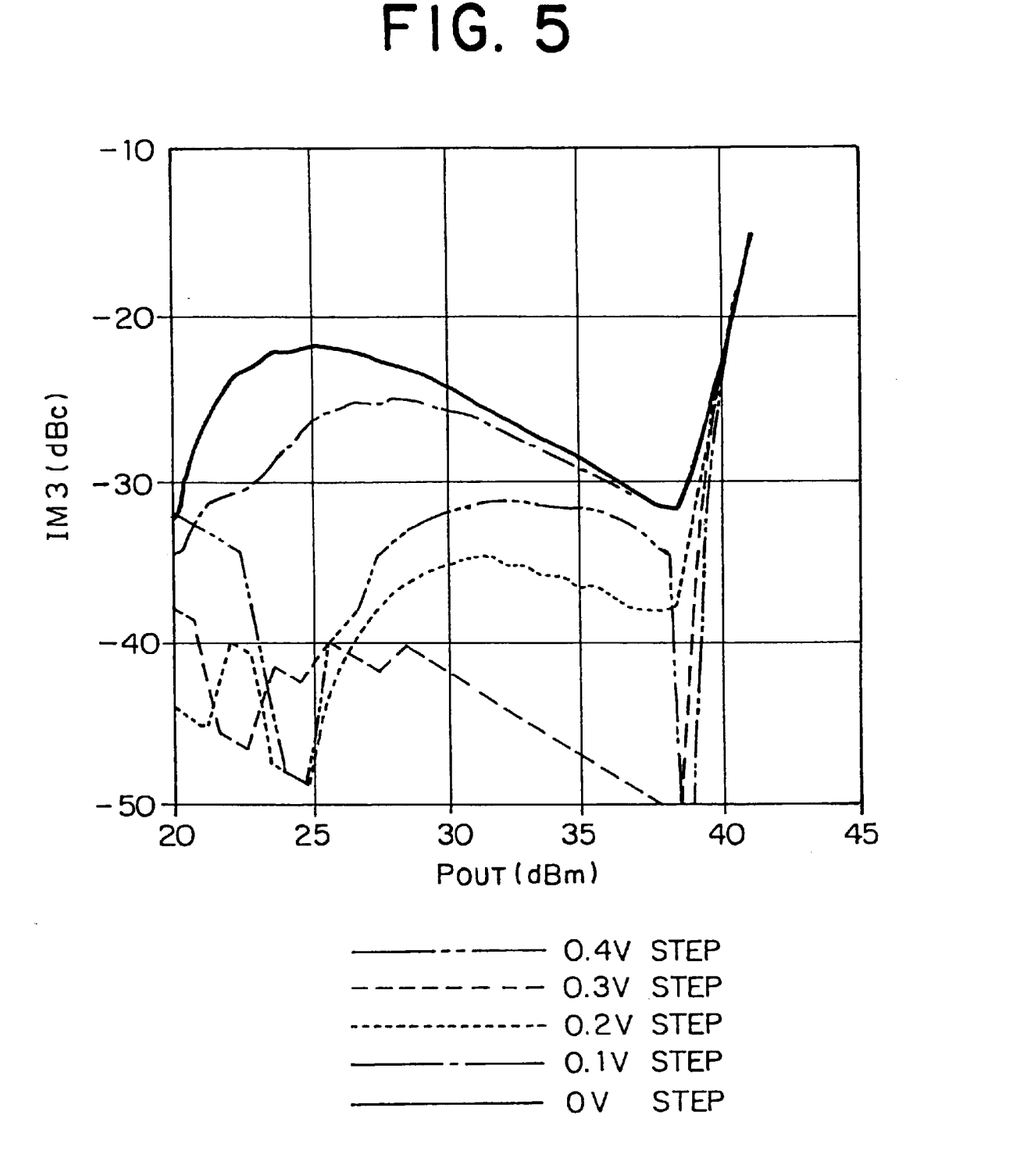
FIG. 5 is another graph showing the relationship between the output level and IM3 of the FET according to the first embodiment, with the step difference in the pinch-off voltage of the unit FETs being a parameter, and with the bias current being 0.5 A.

FIG. 5 shows another graph showing the output level dependence of IM3, with the values for the step difference being a parameter and with the bias current being set at 0.5 A. The values for the step difference include 0.4 volts shown by a two-dot chain line, 0.3 volts shown by broken line, 0.2 volts shown by a dotted line, 0.1 volts shown by a one-dot chain line and 0.0 volt shown by a solid line. As will be understood from the drawing, for the bias current set at 0.5 A, the step difference in the pinch-off voltage is preferably selected between 0.2 and 0.3 volts, so as to reduce IM3 down to a level below −35 dB. Specifically, when the bias current is set at 5% of the maximum drain current, the step difference in the pinch-off voltage is preferably set between 10% and 15% of the mean pinch-off voltage. The step difference can be implemented by selecting the depths of the recesses for the gate fingers of the gate electrode.

Figure 6A:
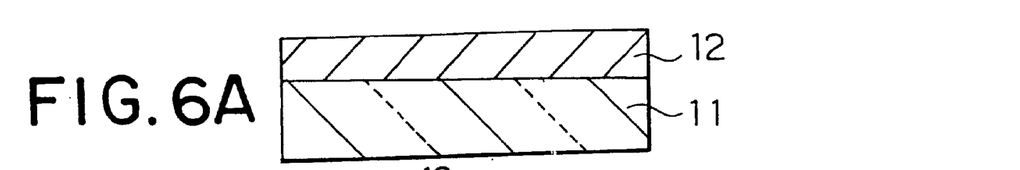
FIGS. 6A to 6F are sectional views of the FET according to the first embodiment in consecutive steps of manufacturing the same taken along line B–B' in FIG. 2A.
Figure 6B:
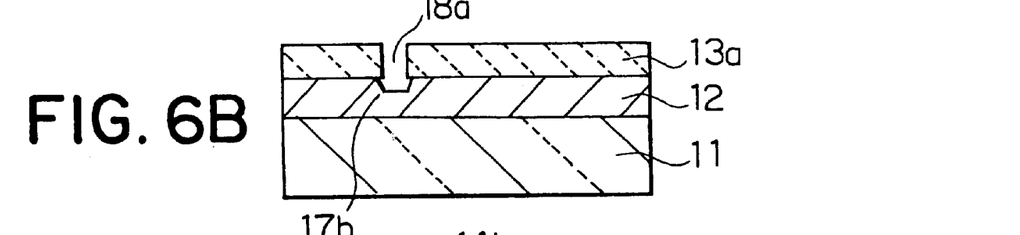
Figure 6C:
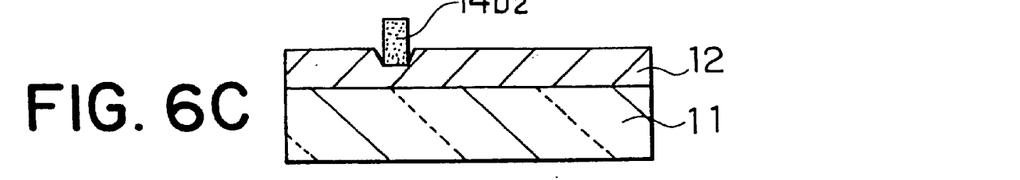

FIGS. 6A to 6F show consecutive steps for manufacturing the FET assembly of the present embodiment, taken along line B–B' in FIG. 2A. First, a 200-nm thick n-GaAs active layer 12 having a carrier concentration of $2.0E17$ $cm^{-3}$ is grown on a semi-insulating substrate 11 by a molecular beam epitaxial technology (MBE), for example, as shown in FIG. 6A. Subsequently, a plurality of 20-nm deep recesses are formed by an etching technology on surface portions of the n-GaAs active layer 12 outside the region shown in the figures, followed by formation of a plurality of first gate fingers of the gate electrode within the recesses. Thereafter, a photoresist film 13a is formed having openings 18a at desired portions for disposing second gate fingers by a photolithographic technology, followed by formation of a plurality of 10-nm deep recesses 17b by etching, one of the recesses being shown in FIG. 6B.

Figure 6D:
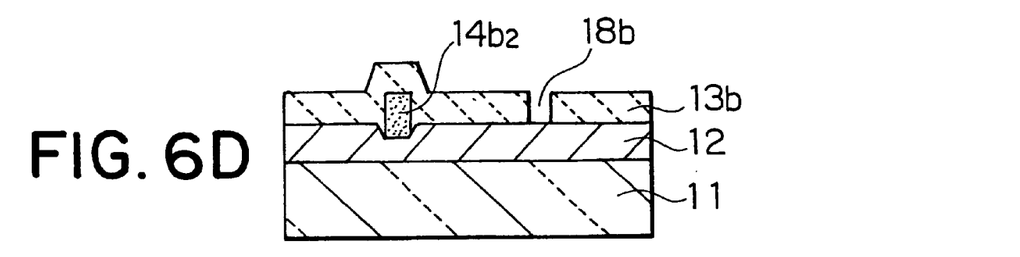
Figure 6E:
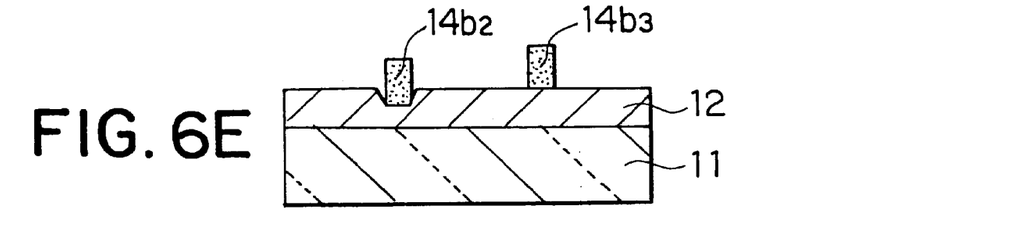
Figure 6F:
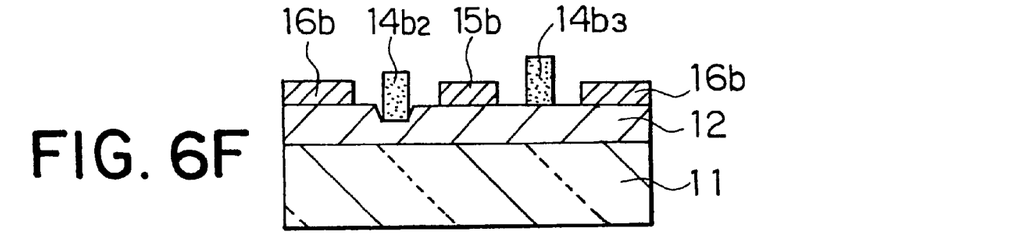

Subsequently, aluminum is deposited by evaporation on the entire surface including the openings 18a and selectively removed by a lift-off technology to leave a plurality of second gate fingers 14b2 in the recess 17b. Another photoresist film 13b is then formed having openings 18b for the desired portions for a plurality of third gate fingers, one of which is shown in FIG. 6D. Aluminum is deposited by evaporation on the entire surface and selectively removed by a lift-off technology to leave the third gate fingers 14b3 on the top surface of the n-GaAs active layer 12. In this manner, three groups of the gate fingers 14b having different pinch-off voltages, which are different from that of each other group by a 0.4-volt step, are formed on the n-GaAs active layer 12. Finally, as shown in FIG. 6F, a two-layer metallic film including AuGe/Ni layers is deposited and patterned to provide a plurality of source electrodes 15b and drain electrodes 16b each disposed in ohmic contact with the n-GaAs active layer 12, thereby obtaining a plurality of unit FETs for the FET assembly of the first embodiment.

Figure 7A:
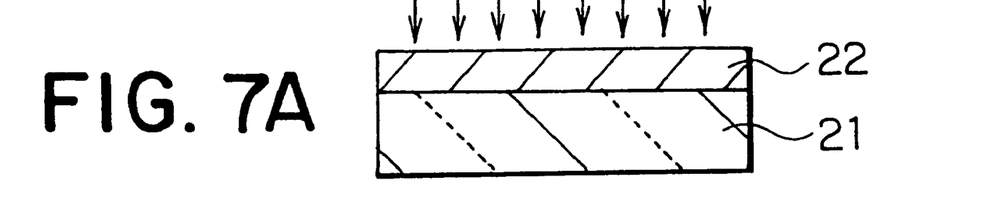
FIGS. 7A to 7D are sectional views of a FET according to a second embodiment of the present invention in consecutive steps of manufacturing the same.
Figure 7B:
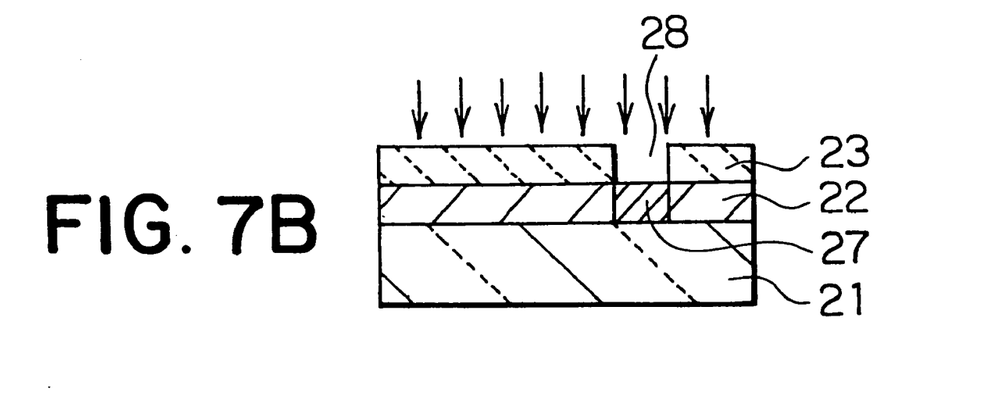
Figure 7C:
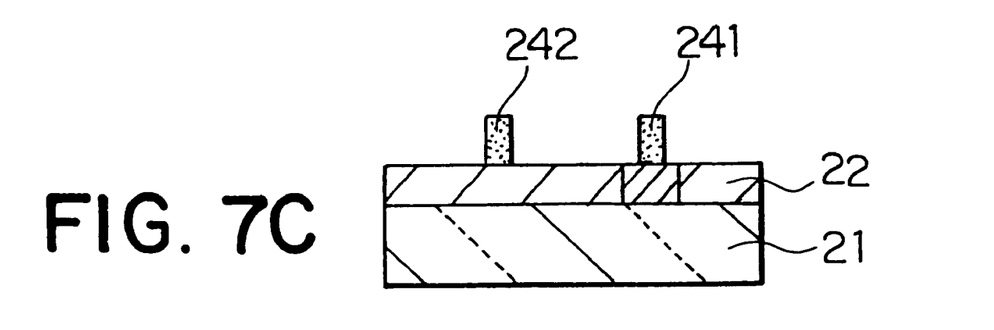
Figure 7D:
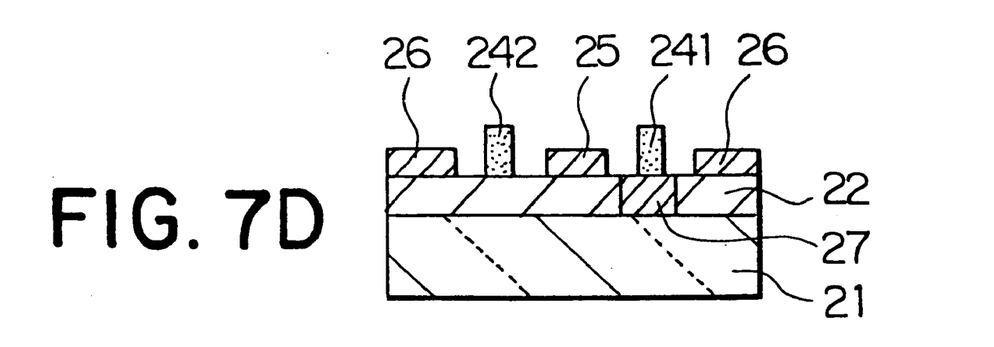

FIGS. 7A to 7D show consecutive steps for manufacturing a FET assembly according to a second embodiment of the present invention, wherein unit FETs having a step difference in the pinch-off voltage are obtained by different impurity concentrations of an n-GaAs active layer 22. First, the n-GaAs active layer 22 is formed by introducing Si ions by ion-implantation into a semi-insulating substrate 21, wherein the active layer 22 has a uniform concentration. Then, a photoresist film 23 is formed having openings 28 for desired portions by a photolithographic technology, followed by ion implantation using the photoresist film 23 as a mask to introduce Si ions by ion-implantation through the openings 28, thereby forming heavily doped regions 27 in the active layer 22. After activating by annealing the Si ions thus introduced, first and second gate fingers 241 and 242 for a gate electrode is formed on the active layer 22 by photolithographic technology and lift-off technology, as shown in FIG. 7C. Finally, source fingers 25 and drain fingers 26 for ohmic contacts are formed by deposition and patterning, thereby obtaining a FET assembly having two-grouped unit FETs having different pinch-off voltages therebetween. In a modification of this embodiment, by iterating a similar implantation of Si ions, more than two groups of the unit FETs having a step difference among the groups can be implemented.

Figure 8A:
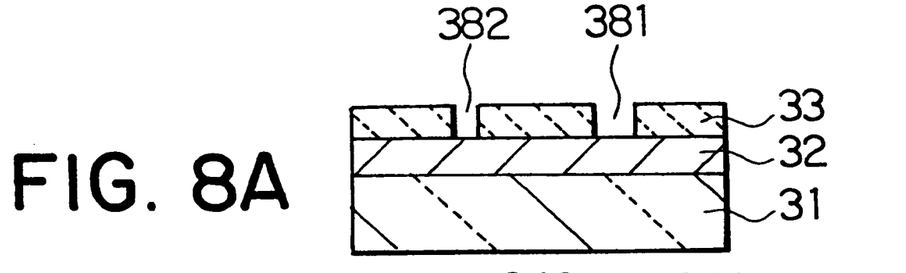
FIGS. 8A to 8C are sectional views of a FET according to a third embodiment of the present invention in consecutive steps of manufacturing the same.
Figure 8B:
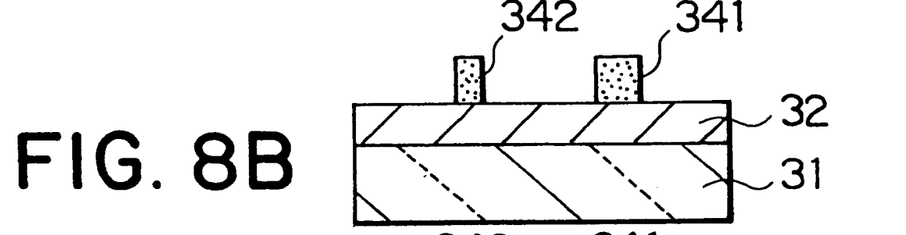
Figure 8C:
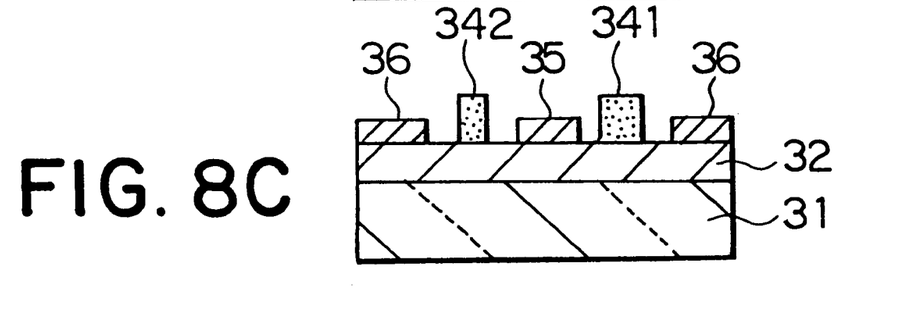

FIGS. 8A to 8C show consecutive steps for manufacturing a FET assembly according to a third embodiment of the present invention, wherein the gate length or channel length is selected for each pinch-off voltage of the unit FET. First, an n-GaAs active layer 32 is formed on a GaAs semi-insulating substrate 31, followed by formation of a photoresist film 33 having openings 381 and 382 which have different widths, as shown in FIG. 8A. Subsequently, gate fingers 341 and 342 having different gate lengths corresponding to the different widths of the openings 381 and 382 are formed by evaporation and lift-off technology, as shown in FIG. 8B. Source fingers 35 and drain fingers 36 for ohmic contacts are then formed such that the gate fingers 341 and 342 are interposed between the respective source fingers 35 and drain fingers 36.

It is known that the different gate lengths for the unit FETs provide different pinch-off voltages due to the short-channel effect, the pinch-off voltages corresponding to the threshold voltages for the unit FETs. For example, it is known that the reduction in gate length from 1 $\mu$m to 0.7 $\mu$m provides 0.5 volt reduction in the threshold voltage. Specifically, the gate lengths of 1 $\mu$m, 0.8 $\mu$m and 0.6 $\mu$m, which include a step distance difference of 0.2 $\mu$m, presents a step difference of approximately 0.3 volts in the pinch-off voltage.

FIGS. 9A to 9D show consecutive steps for manufacturing a FET according to a fourth embodiment of the present invention, wherein a specified stress acting on a passivation film covering the gate electrode is selected for each of gate fingers of the gate electrode to provide the step difference in the pinch-off voltage of the unit FETs.

The stress applied to the passivation film generates piezoelectric charge beneath the gate fingers by a piezoelectric effect, as described by P. M. Asbeck, C. Lee, and M. F. Chang, in "Piezoelectric Effect in GaAs FETs and Their Role in Orientation-Dependent Device Characteristics", IEEE Trans. Electron Devices, vol. ED-31, No. 10, pp. 1377–1380, 1984. As recited in the literature, the sign of the piezoelectric charge depends on the type of the stress and orientation of the crystal. For example, if a gate finger is formed on a (100) crystal, the orientation of the gate width which is $[01^{-1}]$ ($1^{-1}$ means herein a top barred 1) provides a fixed amount of positive charge or negative charge at the location just below the gate finger, depending on the type of the stress, i.e., corresponding to tensile stress or compressive stress. The piezoelectric charge has a function to change the amount of electric charge in the channel layer and the thickness of the depletion layer so that the pinch-off voltage of the unit FET shifts to the deep side or shallow side corresponding to the tensile stress or compressive stress.

Figure 9A:
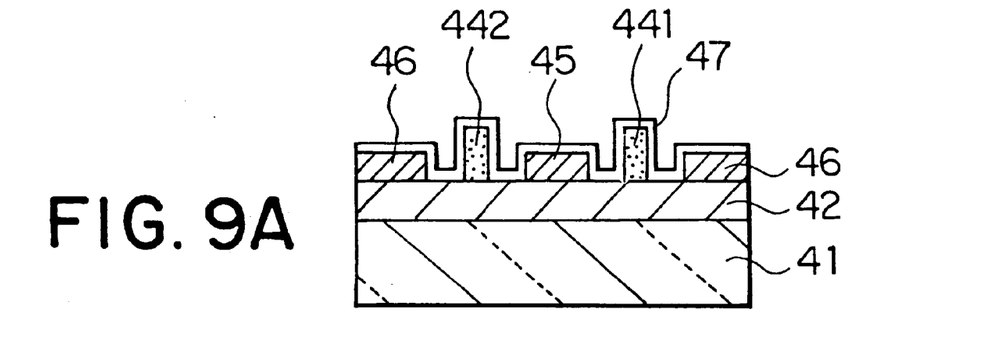
FIGS. 9A to 9D are sectional views of a FET according to a fourth embodiment of the present invention in consecutive steps of manufacturing the same.
Figure 9B:
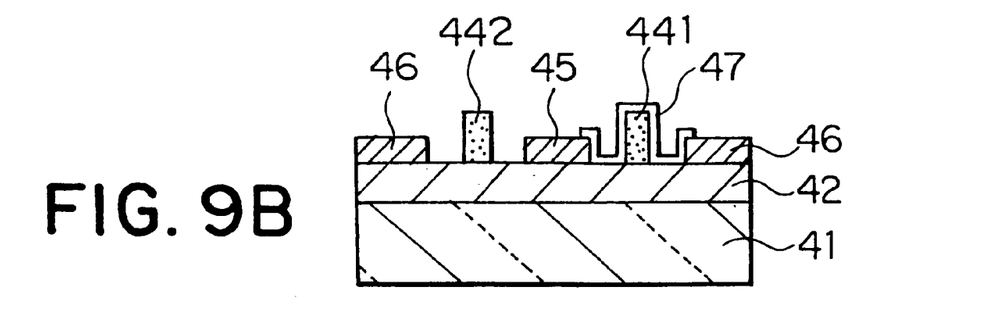
Figure 9C:
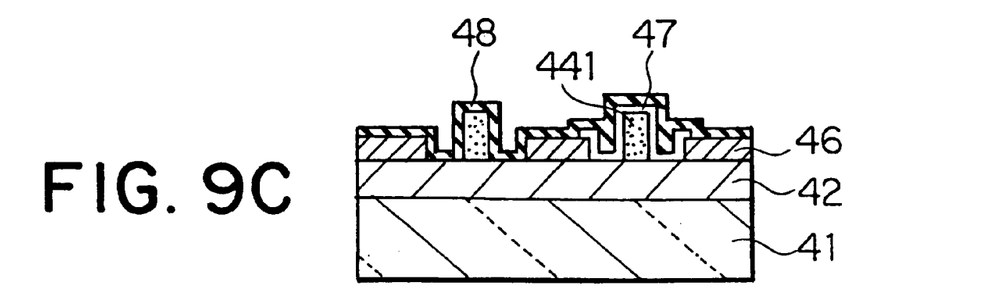

As shown in FIG. 9A, a first insulator film 47 is formed on the entire surface including the surface of a (100)-oriented active n-GaAs layer 42 on which gate fingers 441 and 442, source fingers 45 and drain fingers 46 are formed. The width of each of the gate fingers 441 and 442 is directed in a $[01^{-1}]$ orientation. If the first insulator film 47 is made of CVD $SiO_2$, for example, then a tensile stress is generated therein to induce positive electric charge at the location just below the gate fingers 441 and 442 underlying the first insulator film 47. The first insulator film 47 is then selectively removed by photolithographic and dry etching technique to leave the first insulator film 47 on the gate fingers 441 and in the vicinity thereof, as shown in FIG. 9B. A second insulator film 48 is then formed on the entire surface, as shown in FIG. 9C.

Figure 9D:
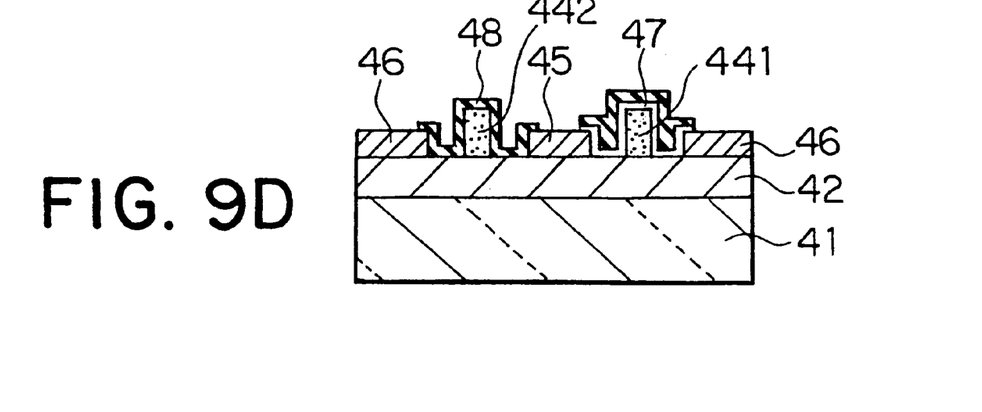

If the second insulator film 48 is made of CVD SiN, then a compressive stress is generated therein. As recited in the literature mentioned above, the step difference in the pinch-off voltage obtained by this configuration is approximately 0.2 volts assuming that the compressive stress in the second insulator film 48 is $5 \times 10^9$ $dyn/cm^2$, film thickness thereof is 0.2 $\mu$m and gate length is 1 $\mu$m. The cancellation of the tensile stress in the first insulator film 47 by the compressive stress in the second insulator film 48 presents the difference in the pinch-off voltage due to the piezoelectric charge induced at the location beneath the gate fingers 442 covered only by the second insulator film 48.

In a modification of the fourth embodiment, by providing a first group of gate fingers covered only by a first insulator film, a second group of gate fingers covered only by a second insulator film and a third group of gate fingers covered by both the first and second insulator films, a FET assembly is formed including three groups of unit FETs having three different pinch-off voltages.

Although the present invention is described with reference to preferred embodiments thereof, the present invention is not limited thereto and various modifications or alterations can be easily made from the embodiments by those skilled in the art without departing from the scope of the present invention as set forth in the appended claims.

What is claimed is:

1. A method of forming a metal-semiconductor field effect transistor (MESFET) assembly, comprising the steps of:
   providing a semi-insulating substrate;
   forming a semiconductor active layer on said semi-insulating substrate;
   forming a source electrode having a plurality of source fingers each disposed in ohmic contact with said semiconductor active layer;

forming a drain electrode having a plurality of drain fingers each disposed in ohmic contact with said semiconductor active layer alternately with said source fingers; and forming a gate electrode having a plurality of gate fingers, said gate fingers being disposed in Schottky contact with said semiconductor active layer between respective said source fingers and said drain fingers to form a plurality of unit FETs including at least first and second unit FETs, said first unit FET having a first pinch-off voltage different from a second pinch-off voltage of said second unit FET.

2. A method as defined in claim 1, wherein said semiconductor active layer has a first thickness for said first unit FET and a second thickness for said second unit FET.

3. A method as defined in claim 1, wherein said semiconductor active layer has a first impurity concentration for said first unit FET and a second impurity concentration for said second unit FET.

4. A method as defined in claim 1, wherein said first unit FET has a first gate length which is larger than a second gate length of said second unit FET.

5. A method as defined in claim 1, wherein said first unit FET has a first gate insulating film having a first stress therein and said second unit FET has a second gate insulating film having a second stress therein, said first stress and second stress being a tensile stress and a compressive stress, respectively.

6. A method as defined in claim 1, wherein said plurality of unit FETs further include a third unit FET having a third pinch-off voltage, a difference between said first pinch-off voltage and second pinch-off voltage is equal to a difference between said second pinch-off voltage and third pinch-off voltage.

7. A method as defined in claim 1, wherein said plurality of unit FETs include a first group of unit FETs including said first unit FET and a second group of unit FETs including said second unit FET, said first group of FETs each having said first pinch-off voltage, said second group of FETs each having said second pinch-off voltage.

8. A method of forming a semiconductor device, comprising the steps of:

providing a semiconductor layer;

forming a source electrode having a plurality of source fingers disposed on said semiconductor layer;

forming a drain electrode having a plurality of drain fingers disposed on said semiconductor layer alternately with said source fingers; and forming a gate electrode having a plurality of gate fingers disposed on said semiconductor layer between respective said source fingers and said drain fingers to form a plurality of unit FETs including at least first and second unit FETs, wherein said first unit FET has a first pinch-off voltage different from a second pinch-off voltage of said second unit FET.

9. A method of forming a semiconductor device as defined in claim 8, whereby intermodulation distortion characteristic of said FETs is improved.

10. A method of forming a semiconductor device as defined in claim 9, wherein said plurality of unit FETs further include a third unit FET having a third pinch-off voltage, a difference between said first pinch-off voltage and second pinch-off voltage is equal to a difference between said second pinch-off voltage and third pinch-off voltage.

11. A method of forming a semiconductor device as defined in claim 10, wherein said semiconductor layer includes a semiconductor active layer, formed on a semi-insulating substrate, having a first thickness for said first unit FET and a second thickness for said second unit FET.

12. A method of forming a semiconductor device as defined in claim 11, wherein said source fingers and said drain fingers are formed in ohmic contact with said semiconductor layer.

13. A method of forming a semiconductor device as defined in claim 12, wherein said gate fingers are formed in Schottky contact with said semiconductor layer.

14. A method of forming a semiconductor device as defined in claim 13, wherein said voltage difference between said first pinch-off voltage and said second pinch-off voltage is in the range of 0.1 V to 0.4 V.

15. A method of forming a semiconductor device as defined in claim 14, wherein said voltage difference between said first pinch-off voltage and said second pinch-off voltage is set in the range of 10% to 15% of a mean pinch off voltage of said FETs.

16. A method of forming a semiconductor device as defined in claim 15, wherein said intermodulation distortion characteristic of said FETs is a third order component IM3.

17. A method of forming a semiconductor device as defined in claim 16, wherein said semiconductor active region is n-GaAs.

18. A method of forming a semiconductor device as defined in claim 17, wherein said FETs are MESFETs.

19. A method of forming a semiconductor device as defined in claim 8, wherein said semiconductor layer has a first impurity concentration for said first unit FET and a second impurity concentration for said second unit FET.

20. A method of forming a semiconductor device as defined in claim 8, wherein said first unit FET has a first gate length which is larger than a second gate length of said second unit FET.

21. A method of forming a semiconductor device as defined in claim 8, wherein said first unit FET has a first gate insulating film formed having a first stress therein and said second unit FET has a second gate insulating film formed having a second stress therein, said first stress and second stress being a tensile stress and a compressive stress, respectively.

22. A method of forming semiconductor device as defined in claim 21, wherein forming said first gate insulating film includes forming an oxide and forming said second gate insulating film includes forming a nitride.

23. A method of forming a transistor device, comprising:

forming a source electrode having a plurality of source fingers interdigitated with a plurality of drain fingers of a drain electrode; and forming a plurality of gate fingers of a gate electrode disposed between respective said source fingers and said drain fingers to form a plurality of unit FETs including at least first and second unit FETs, wherein said first unit FET has a first pinch-off voltage different from a second pinch-off voltage of said second unit FET.

24. A method of forming a transistor device as defined in claim 23, further comprising forming a semiconductor layer including a semiconductor active layer formed on a semi-insulating substrate, said semi-insulating layer having a first thickness for said first unit FET and a second thickness for said second unit FET so as to set said first pinch-off voltage different from said second pinch-off voltage.

25. A method of forming a transistor device as defined in claim 23, further comprising the steps of forming a semiconductor layer having a first impurity concentration for said first unit FET and forming a second impurity concentration for said second unit FET so as to set said first pinch-off voltage different from said second pinch-off voltage.

26. A method of forming a transistor device as defined in claim 23, wherein said first unit FET has a first gate length which is larger than a second gate length of said second unit FET so as to set said first pinch-off voltage different from said second pinch-off voltage.

27. A method of forming a transistor device as defined in claim 23, wherein said step of forming said first unit FET includes forming a first gate insulating film having a first stress therein and said step of forming said second unit FET includes a step of forming a second gate insulating film having a second stress therein, said first stress and second stress being a tensile stress and a compressive stress, respectively, so as to set said first pinch-off voltage different from said second pinch-off voltage.

28. A method of forming a transistor device as defined in claim 24, whereby intermodulation distortion characteristic of said FETs is improved.

29. A process for forming a transistor device, comprising:

forming a source electrode having a plurality of source fingers interdigitated with a plurality of drain fingers of a drain electrode;

forming a plurality of gate fingers of a gate electrode disposed between respective said source fingers and said drain fingers to form a plurality of unit FETs including at least first and second unit FETs; and forming a means for adjusting a first pinch-off voltage of said first unit FET to be different from a second pinch-off voltage of said second unit FET.

* * * * *

UNITED STATES PATENT AND TRADEMARK OFFICE
CERTIFICATE OF CORRECTION

PATENT NO. : 6,033,942
DATED : March 7, 2000
INVENTOR(S) : Hidemasa Takahashi, Junko Morikawa It is certified that error appears in the above-identified patent and that said Letters Patent is hereby corrected as shown below:

<u>Column 4,</u>
Line 16, delete "inch" insert -- pinch --;
Line 37, delete "dB" insert -- dbc --

Signed and Sealed this

Thirteenth Day of November, 2001

Attest:

NICHOLAS P. GODICI
Attesting Officer
Acting Director of the United States Patent and Trademark Office